United States Patent [19]
Shin et al.

[11] Patent Number: 6,159,811
[45] Date of Patent: *Dec. 12, 2000

[54] METHODS FOR PATTERNING MICROELECTRONIC STRUCTURES USING CHLORINE, OXYGEN, AND FLUORINE

[75] Inventors: Hwa-sook Shin; Kyeong-koo Chi, both of Kyungki-do; Chan-ouk Jung, Seoul, all of Rep. of Korea

[73] Assignee: Samsung Electronics Co., Ltd., Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/857,754

[22] Filed: May 15, 1997

Related U.S. Application Data

[63] Continuation-in-part of application No. 08/782,305, Jan. 15, 1997.

[30] Foreign Application Priority Data

May 15, 1996 [KR] Rep. of Korea ............... 96-16264
Apr. 30, 1997 [KR] Rep. of Korea ............... 97-16816

[51] Int. Cl.$^7$ ............................................. H10L 21/336
[52] U.S. Cl. ....................... 438/303; 438/585; 438/592; 438/721
[58] Field of Search ......................... 438/585, 592, 438/721

[56] References Cited

U.S. PATENT DOCUMENTS

| | | |
|---|---|---|
| 4,478,678 | 10/1984 | Watanabe ............... 156/643 |
| 4,490,209 | 12/1984 | Hartman ................ 156/643 |
| 4,543,597 | 9/1985 | Shibata . |
| 4,615,764 | 10/1986 | Bobbio et al. . |
| 4,789,426 | 12/1988 | Pipkin . |
| 5,134,085 | 7/1992 | Gilgen et al. ............... 437/52 |
| 5,160,407 | 11/1992 | Latchford et al. ......... 156/656 |
| 5,219,485 | 6/1993 | Wang et al. ............... 252/79.3 |
| 5,704,433 | 1/1998 | Olson et al. . |
| 5,716,495 | 2/1998 | Butterbaugh et al. . |
| 5,741,396 | 4/1998 | Loewenstein . |

FOREIGN PATENT DOCUMENTS

| | | |
|---|---|---|
| 63-119533 | 5/1988 | Japan . |
| 2-084723 | 3/1990 | Japan . |
| 2-84723 | 3/1990 | Japan . |
| 2-094520 | 4/1990 | Japan . |
| 2-94520 | 4/1990 | Japan . |
| 3-241829 | 10/1991 | Japan . |

OTHER PUBLICATIONS

Notice to Submit Response, Korean Application No. 1997–16816.
Wolf et al., Silicon Processing for the VSLI Era, vol. 1–Process Technology, p. 192 1988.
S.M. Sze, *VLSI Technology*, Second Edition, McGraw–Hill Press, 1988, pp. 200–204.

*Primary Examiner*—John F. Niebling
*Assistant Examiner*—Jonathan Hack
*Attorney, Agent, or Firm*—Myers Bigel Sibley & Sajovec

[57] ABSTRACT

A method for forming a gate structure on a semiconductor substrate includes the following steps. A layer of a gate material is formed on the semiconductor substrate, and a patterned mask layer is formed on the layer of the gate material opposite the substrate. The layer of the gate material is then etched with an etching gas including a mixture of chlorine gas ($Cl_2$), oxygen gas ($O_2$), and a gas including fluorine (F) using the patterned mask layer as an etching mask. In particular, the step of forming the layer of the gate material can include the steps of forming a polysilicon layer on a surface of the semiconductor substrate, and forming a silicide layer on the polysilicon layer opposite the substrate.

27 Claims, 11 Drawing Sheets

● ; POLYSILICON
▲ ; ETCHING SELECTIVITY
■ ; TiSix

FIG. 10

● ; POLYSILICON
▲ ; ETCHING SELECTIVITY
■ ; TiSix

METHODS FOR PATTERNING MICROELECTRONIC STRUCTURES USING CHLORINE, OXYGEN, AND FLUORINE

RELATED APPLICATIONS

This application is a continuation-in-part of copending U.S. patent application Ser. No. 08/782,305, filed Jan. 15, 1997, entitled "METHODS FOR PATTERNING MICROELECTRONIC STRUCTURES USING CHLORINE AND OXYGEN", which claimed priority from Korean Application No. 1996-16264, filed May 15, 1996, which are hereby incorporated herein in their entirety by reference. This application also claims priority from Korean Application No.1997-16816, filed Apr. 30, 1997, which is also incorporated herein in its entirety by reference.

FIELD OF THE INVENTION

The present invention relates to the field of microelectronics and more particularly to methods for patterning microelectronic structures.

BACKGROUND OF THE INVENTION

As the integration densities of semiconductor devices continue to increase, the widths of gate electrodes are generally reduced. As the width of a conventional doped polysilicon gate electrode approaches 0.25 microns ($\mu$m), however, its performance may deteriorate. In particular, as the resistance of the polysilicon gate increases with the reduction of the width, the transmission of a gate signal may thus be delayed. Furthermore, when a sufficiently narrow polysilicon gate is used in a p-MOS transistor, short channel effects may increase because of the buried channel formed to lower the threshold voltage.

In order to reduce the effects of the above mentioned problems, the formation of gate electrodes from a conductive material having a relatively low resistivity and a work function corresponding to the midgap of silicon have been investigated. In particular, it has ben noted that a polycide structure formed from a silicide (a compound formed of metal and silicon which is heat-treated) and polysilicon can be used as a gate electrode material in place of a doped polysilicon structure.

The polycide structure can include tungsten silicide ($WSi_x$) or titanium silicide ($TiSi_x$) as the silicide. Alternately, a silicide including a metal having a relatively high melting point, such as a cobalt silicide ($CoSi_x$) for example, can be used. Of the above mentioned silicides, titanium silicide (hereinafter referred to as $TiSi_x$) excels in thermal stability and has a relatively low resistivity which is about one quarter that of tungsten silicide ($WSi_x$). $TiSi_x$ is thus considered a very suitable material for a gate electrode, and in particular for a gate electrode for a device such as a dynamic random access memory (DRAM) with a memory capacity of over 1 gigabit. The use of titanium silicide ($TiSi_x$) in a gate electrode can provide improved transistor operation due to its relatively low resistivity and the midgap work function of silicon.

The titanium silicide and polysilicon layers which make up the gate pattern can be etched using a dry etching technique. In particular, a fluorine-series gas (e.g., sulfur hexafluoride $SF_6$ or carbon tetrafluoride $CF_4$), a chlorine-series gas (e.g., hydrogen chloride HCl, chlorine gas $Cl_2$ or boron trichloride $BCl_3$), and/or hydrogen bromide HBr can be used as the etching gas. The $TiSi_x$ layer and the polysilicon layer, however, may be susceptible to sidewall erosion during the etch. This sidewall erosion of the gate structure may cause a bridge to form between conductive layers due to a stringer phenomenon wherein a conductive material remains at the eroded portion after the next processing step (e.g., a pad electrode formation step). The reliability of the semiconductor device may thus be decreased and product yield reduced.

The gate oxide layer may also be damaged because fluorine-series gasses and boron trichloride ($BCl_3$) have low etching selectivities with respect to the oxide. In addition, when hydrogen bromine (HBr) is used as the etching gas, it may react with the $TiSi_x$ layer 8 to produce a significant amount of polymer (i.e., a non-volatile residue) which may remain between the gate electrodes being patterned making it difficult to adjust the critical dimension thereof. Furthermore, when only chlorine gas ($Cl_2$) is used as the etching gas with a hard mask instead of photoresist, severe sidewall erosion may occur.

Figure 1:
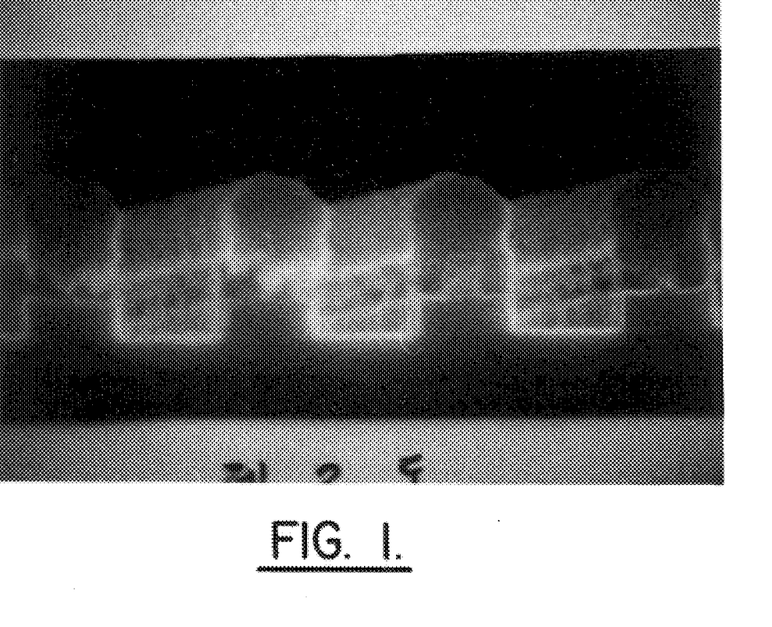
FIG. 1 is a scanning electron microscope (SEM) photograph of a polycide pattern etched using chlorine gas ($Cl_2$) according to the prior art.

FIG. 1 is a scanning electron microscope (SEM) photograph of a titanium silicide ($TiSi_x$) layer which has been etched using only chlorine gas ($Cl_2$). As shown, the titanium silicide layer and the underlying polysilicon layer may be undesirably eroded along sidewalls thereof. When etching a polycide layer, the etching mask can be a silicon nitride layer deposited using a low pressure chemical vapor deposition at a temperature of approximately 700° C. or a silicon nitride layer deposited using plasma-enhanced chemical vapor deposition at a temperature of approximately 400° C.

Improved sheet resistance can be provided when using a LPCVD nitride layer etching mask as opposed to a PECVD nitride layer etching mask. As shown in the SEM photograph of FIG. 2, however, a residue may remain in the open regions after the polycide film has been etched using the LPCVD nitride layer etching mask. This residue may be caused by segregation of extra silicon (Si) when heat is applied to a silicide layer. When a PECVD nitride layer etching mask is used, the etching residue may be reduced. A polymer, however, may be generated along sidewalls of the gate pattern during a subsequent self-aligned contact (SAC) step. This polymer can increase the sheet resistance of the gate when compared with gates formed using LPCVD nitride layer etching masks.

Notwithstanding the methods discussed above, there continues to exist a need in the art for improved methods of forming gate structures.

SUMMARY OF THE INVENTION

It is therefore an object of the present invention to provide improved methods for forming gate electrode structures.

It is another object of the present invention to provide methods for forming gate electrode structures which can have reduced resistivity.

It is still another object of the present invention to provide methods for forming gate electrode structures which can reduce residue between gate electrodes.

It is yet another object of the present invention to provide methods for forming gate electrode structures which can reduce sidewall erosion thereof.

These and other objects are provided according to the present invention by methods including the steps of forming a layer of a gate material on a semiconductor substrate, forming a patterned mask layer on the gate material, and etching the layer of the gate material with an etching gas including a mixture of chlorine gas ($Cl_2$), oxygen gas ($O_2$), and a gas including fluorine (F), while using the patterned mask layer as an etching mask. The step of forming the layer of the gate material can include forming a polysilicon layer on the semiconductor substrate, and forming a silicide layer on the polysilicon layer opposite the substrate. The use of the etching gas mixture including chlorine gas and oxygen gas can thus improve the profile of the resulting gate electrodes and reduce residue between gate electrodes. In particular, etch byproducts may serve as a protective film on the gate electrode sidewalls thereby reducing sidewall erosion.

In particular, the gas including fluorine can be a gas such as sulfur hexafluoride or carbon tetrafluoride. Alternately, the gas including fluorine can be a carbon-fluorine series gas such as carbon tetrafluoride, hexafluoroethane, decafluorobutane, or methane monofluoride.

In addition, the mask layer can be a silicon nitride mask layer, and the patterned silicon nitride mask layer can be formed by low pressure chemical vapor deposition (LPCVD) at a temperature of at least 500° C. The gas including the fluorine preferably makes up no more than 80 percent of the etching gas, and the etching gas including chlorine gas, oxygen gas, and the gas including fluorine can be mixed with nitrogen. Furthermore, a ratio of the chlorine gas to the oxygen gas can be approximately 4 to 1.

Accordingly, the methods of the present invention can be used to provide gate electrode structures having reduced resistivity, reduced sidewall erosion, and reduced residues.

BRIEF DESCRIPTION OF THE DRAWINGS

The above objects and advantages of the present invention will become more apparent by describing in detail preferred embodiments thereof with reference to the attached drawings wherein.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

The present invention relates to improved methods for forming polycide gate structures. The methods of the present invention allow the formation of polycide gate structures with reduced sidewall erosion and reduced residue generation. In particular, when dry etching a Ti-polycide layer to form a Ti-polycide gate electrode according to the present invention, oxygen gas $O_2$ is added to chlorine gas $Cl_2$ during the dry etch to reduce sidewall erosion. Additional etch parameters are discussed in greater detail below. For example, the dry etch used to form the gate electrodes of the present invention can be performed at a pressure of 2 mTorr while maintaining the temperature at a normal level.

The following formulas illustrate the chemical reactions which occur when etching titanium silicide using a gas mixture including $Cl_2$ and $O_2$:

$$TiSi_x + Cl_2 \rightarrow TiCl_x, SiCl_x \qquad (1)$$

$$TiSi_x + O_2 \rightarrow TiO_x, SiO_x \qquad (2).$$

According to formulas (1) and (2), when the gas mixture including $Cl_2$ and $O_2$ is used as an etching gas to etch $TiSi_x$, chlorides (e.g., $TiCl_4$ and $SiCl_4$) and oxides (e.g., TiO and SiO) are produced as byproducts. The chlorides, such as $TiCl_4$ and $SiCl_4$, produced in formula (1) are volatilized during the etch. The non-volatile oxides, such as TiO and SiO, produced in formula (2), however, may adhere to the sidewalls of the polycide structure during the etch and provide a protective layer so that sidewall erosion of the polycide structure can be reduced.

Figure 3:
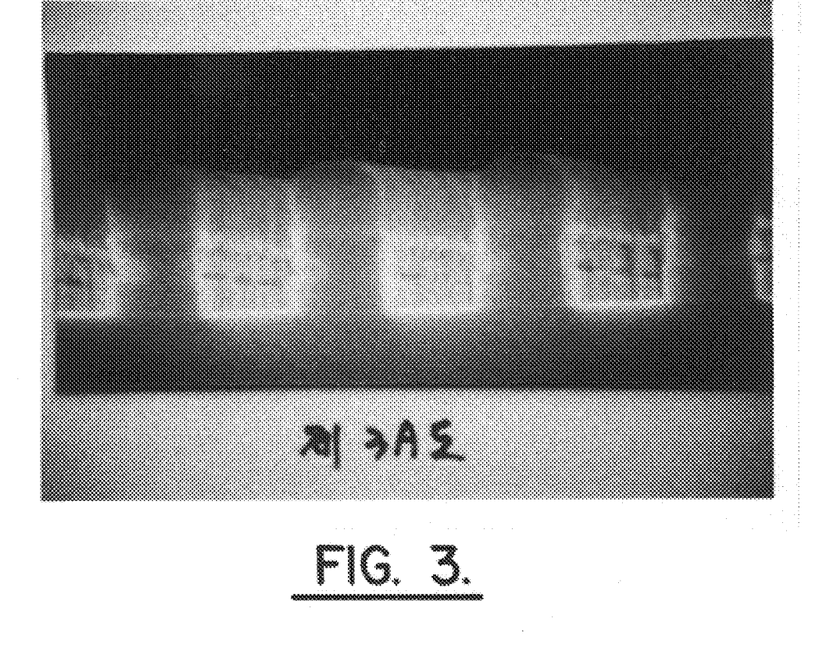
FIGS. 3–5 are scanning electron microscope (SEM) photographs illustrating gate electrodes formed using an etching gas mixture including oxygen gas ($O_2$) to etch a polycide structure according to the present invention.
Figure 4:
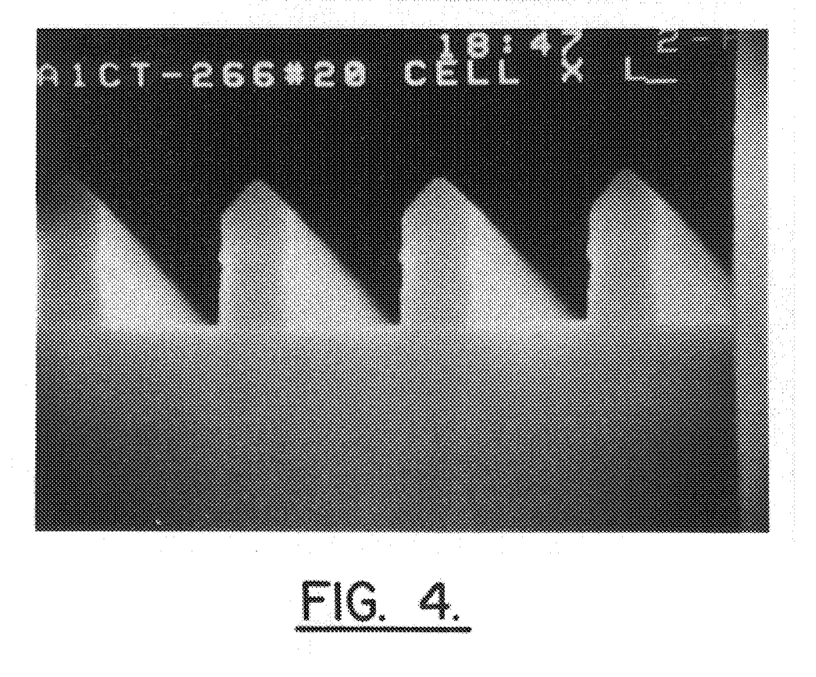
Figure 5:
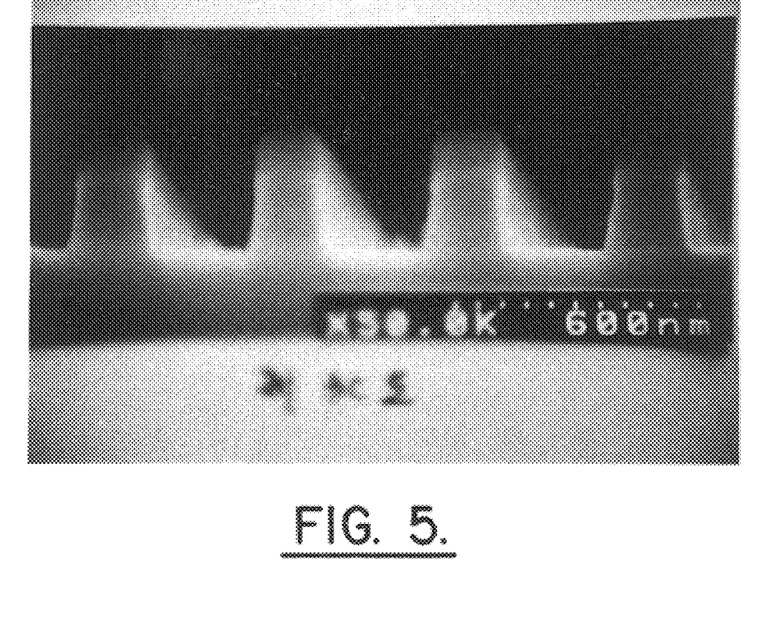

FIGS. 3 to 5 are SEM photographs of patterned $TiSi_x$ structures formed when oxygen gas $O_2$ is added to the chlorine gas $Cl_2$ at respective volumetric ratios of 10%, 20%, and 30%, and the resulting gas mixture is used to etch the $TiSi_x$ layer. As shown, the oxygen gas $O_2$ is preferably added at the ratio of approximately 20% to provide a polycide gate electrode structure having the most desirable profile. When the oxygen gas $O_2$ is added at a ratio of over 30%, the oxide polymer may be excessively produced causing a positive pattern profile and/or generating residues within a cell. It is thus preferred that the ratio of oxygen gas ($O_2$) is maintained at 30 percent or less.

The determination of appropriate substrate temperatures and bias powers to be provided during the dry etch will now be discussed. In particular, temperatures and bias powers are desired which reduce sidewall erosion and which reduce the formation of residues along bottom surfaces of open areas when performing the dry etch using the gas mixture including $Cl_2$ and $O_2$.

Figure 6:
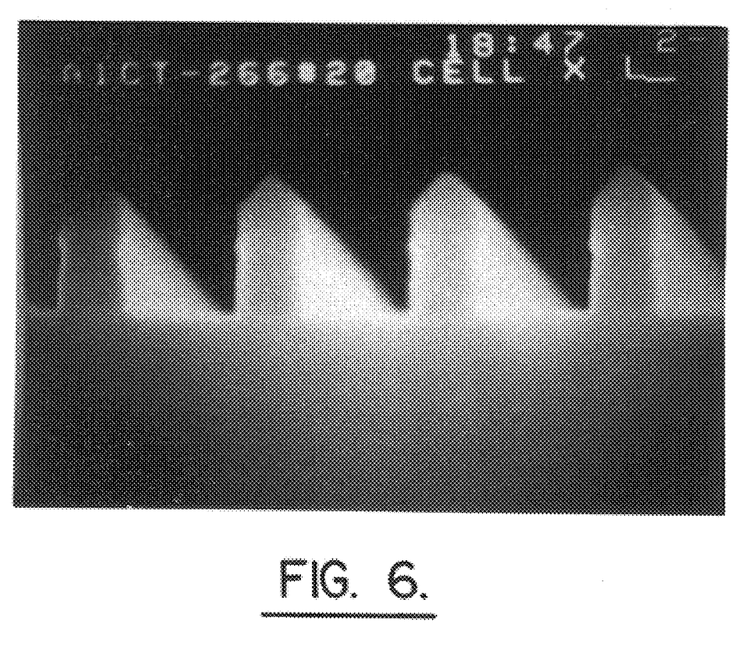
FIGS. 6–8 are scanning electron microscope (SEM) photographs illustrating gate electrodes formed by etching a polycide structure using a gas mixture including oxygen gas ($O_2$) and chlorine gas ($Cl_2$) at different temperatures according to the present invention.
Figure 7:
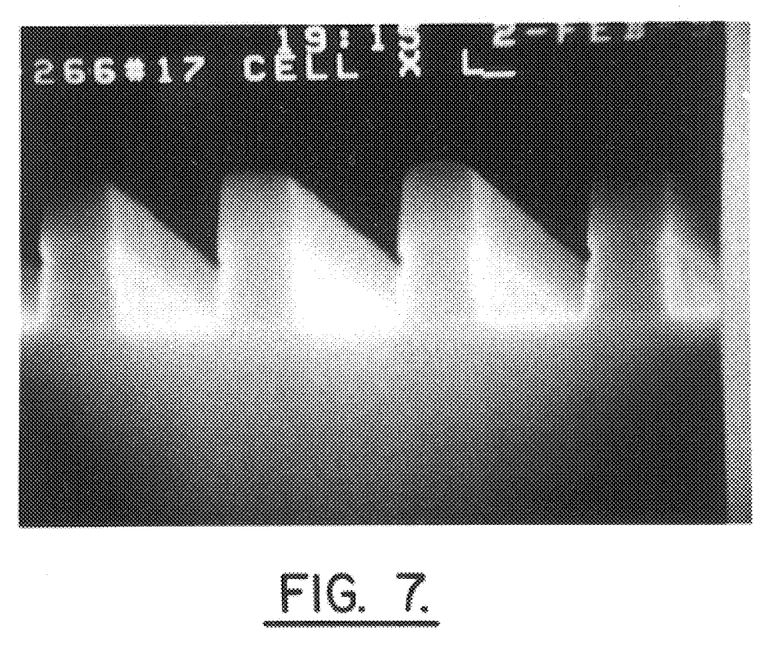
Figure 8:
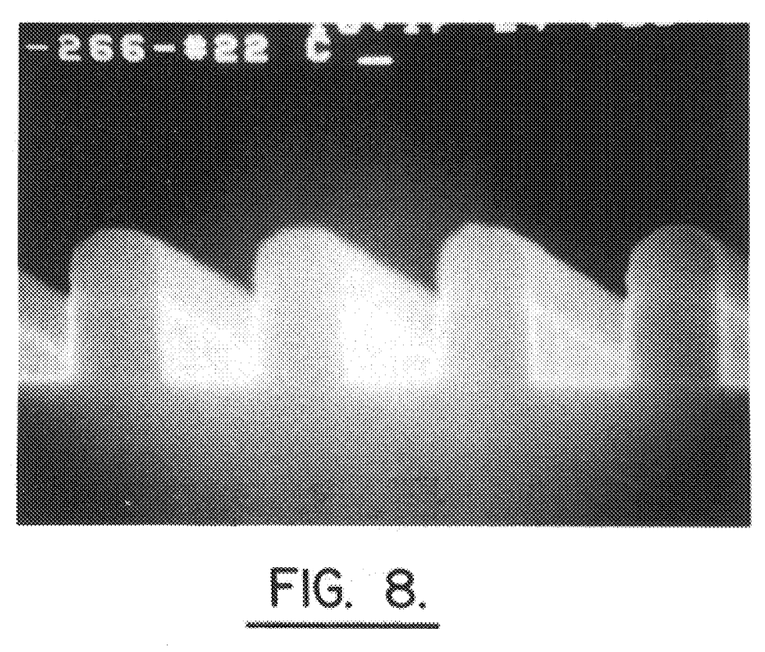

FIGS. 6 to 8 are SEM photographs of gate electrode patterns which have been dry etched at respective substrate temperatures of 0° C., −30° C., and −50° C. The polycide layer has been etched using the gas mixture including $Cl_2$ and $O_2$ wherein the oxygen gas $O_2$ is mixed at the volumetric ratio of 20%. As shown, an active reaction at the sidewalls is reduced as the temperature of the substrate decreases so that oxide byproducts such as TiO can serve as a protective layer. As shown in FIG. 8, the sidewall erosion is significantly reduced. Residues may, however, be generated on the bottom surface of the pattern. The $TiSi_x$ layer may be incompletely etched because an etching selectivity between the polysilicon layer and the $TiSi_x$ layer may decrease with a decrease in the temperature of the substrate. Accordingly, residues may result.

Figure 9:
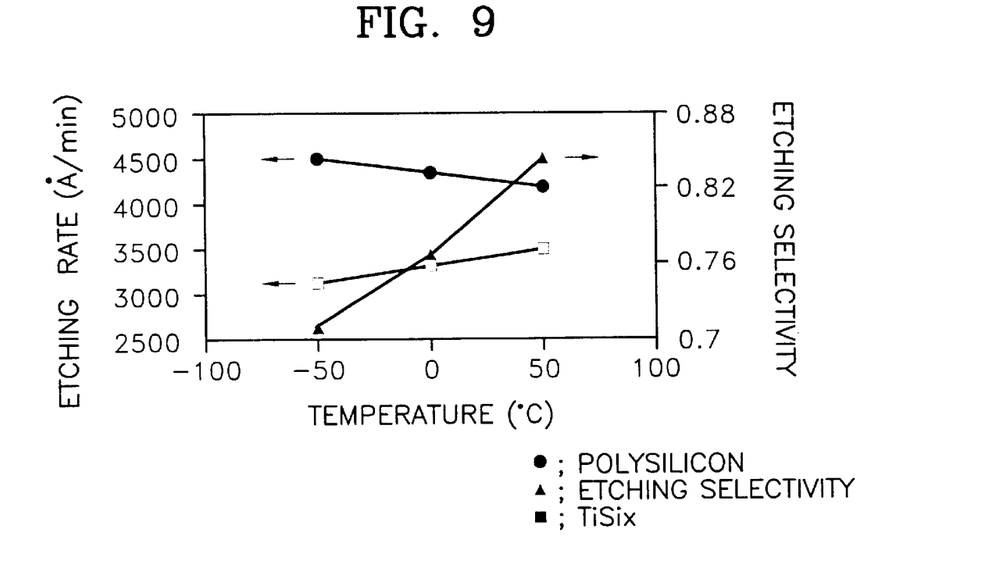
FIG. 9 is a graph illustrating etching rates of polysilicon and $TiSi_x$ layers as a function of the temperature of the substrate according to the present invention.

FIG. 9 is a graph illustrating etching rates of the polysilicon layer and the $TiSi_x$ layer versus the temperature of the substrate. FIG. 9 also illustrates an etching selectivity between the polysilicon layer and the $TiSi_x$ layer within the substrate temperature range of −50° C. to 50° C. As shown, the etching selectivity between the two layers increases as the temperature of the substrate increases, and the increased selectivity favorably reduces the residues.

Figure 10:
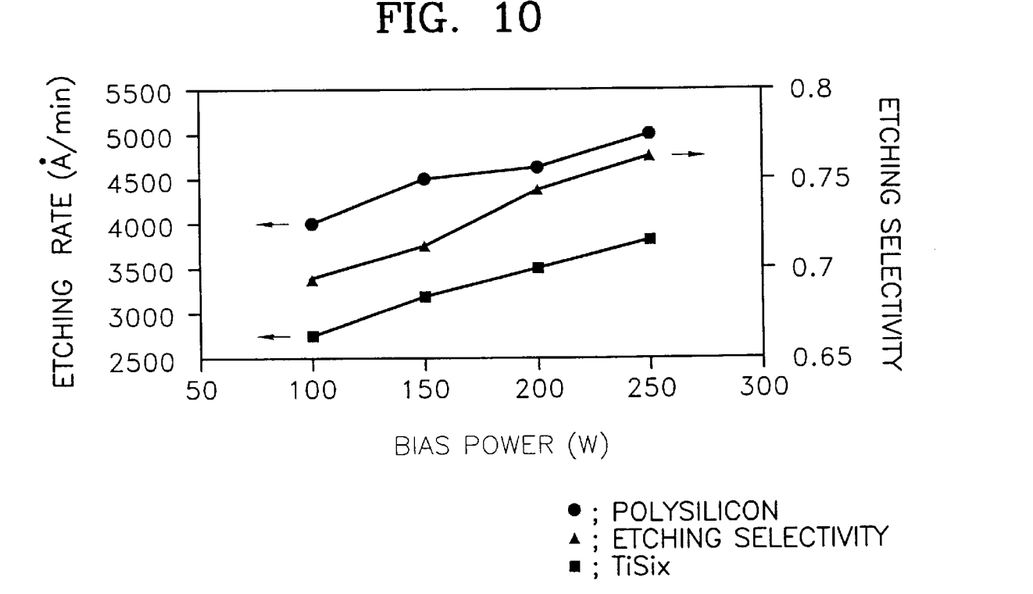
FIG. 10 is a graph illustrating etching rates of polysilicon and $TiSi_x$ layers as a function of bias power according to the present invention.

Alternately, the residues generated at low substrate temperatures can be removed by applying an appropriate bias power thereto. FIG. 10 is a graph illustrating etching rates of the polysilicon and $TiSi_x$ layers versus bias power. When an appropriate etching gas and an appropriate substrate temperature are provided, the etching selectivity between the polysilicon and $TiSi_x$ films increases as the bias power increases.

Figure 11:
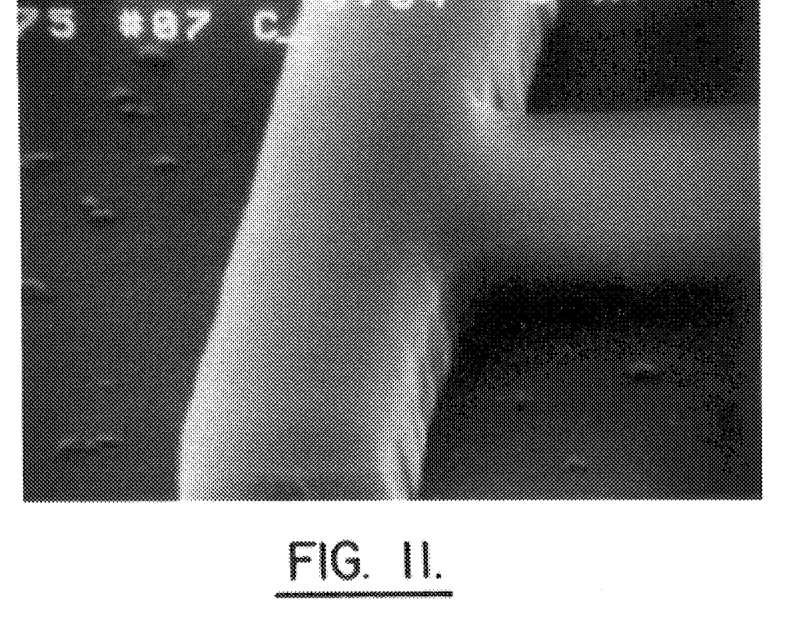
FIGS. 11–13 are scanning electron microscope (SEM) photographs illustrating polycide gate structures formed according to the present invention.
Figure 12:
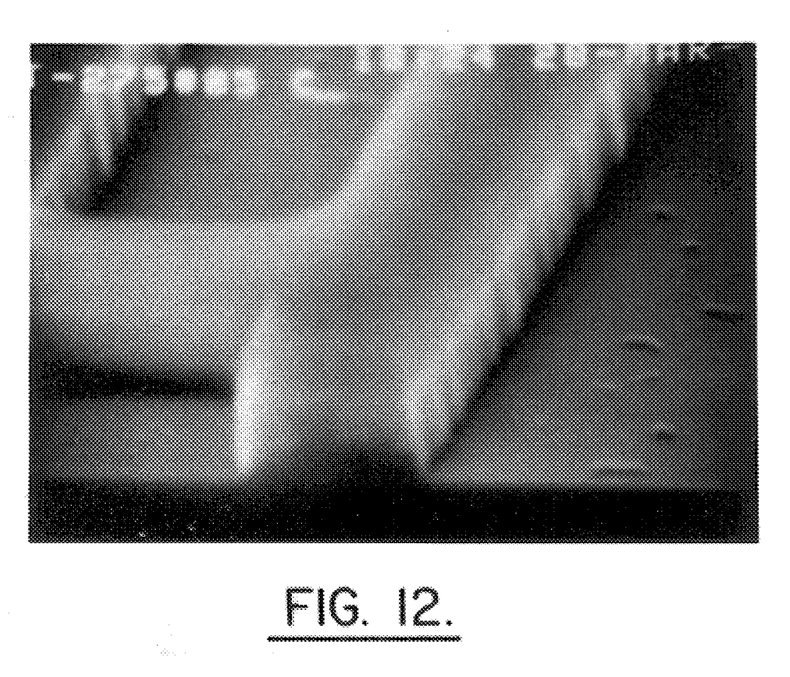
Figure 13:
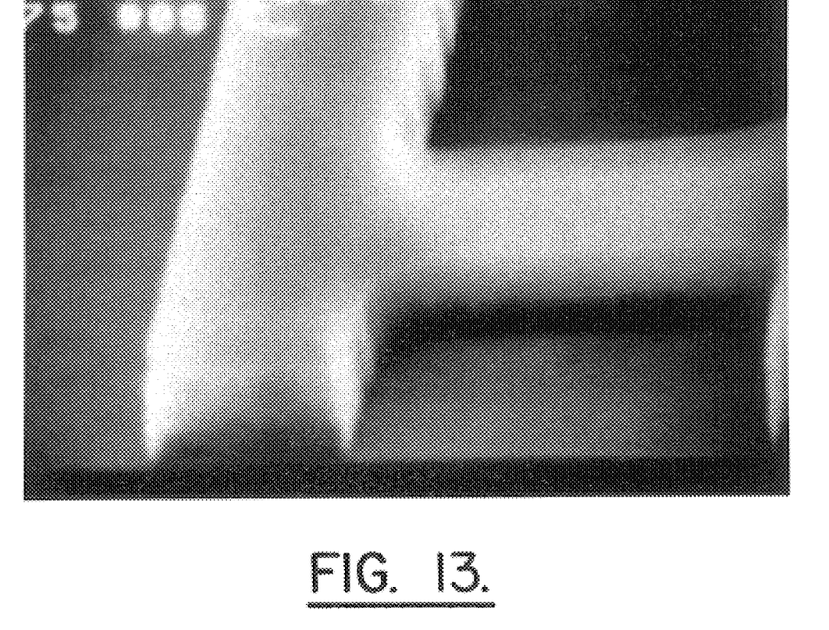

FIGS. 11 to 13 are SEM photographs illustrating polycide gate structures formed using respective bias powers of 150 W, 200 W, and 250 W. The effectiveness of the residue removal can be observed at the different bias powers. The temperature of the substrates was maintained at −50° C., and a source power of 600 W was applied. Even though a temperature of the substrate was about −50° C., residues are almost nonexistent when a bias power of about 250 W is applied.

Figure 14:
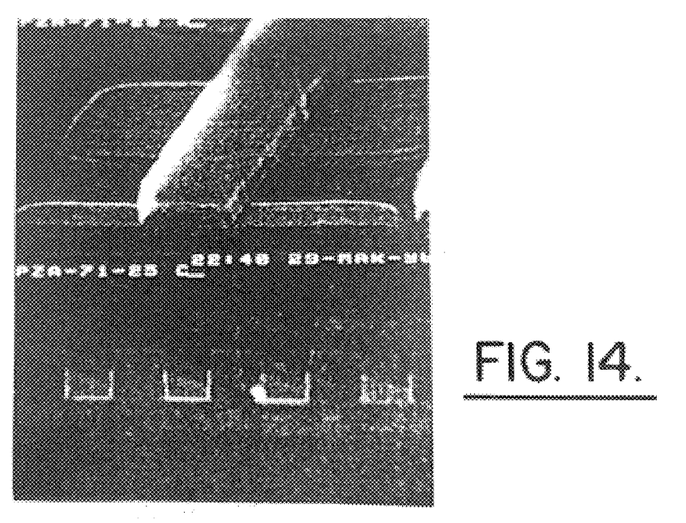
FIGS. 14 and 15 are scanning electron microscope (SEM) photographs illustrating gate electrodes formed using different etch temperatures and bias powers according to the present invention.
Figure 15:
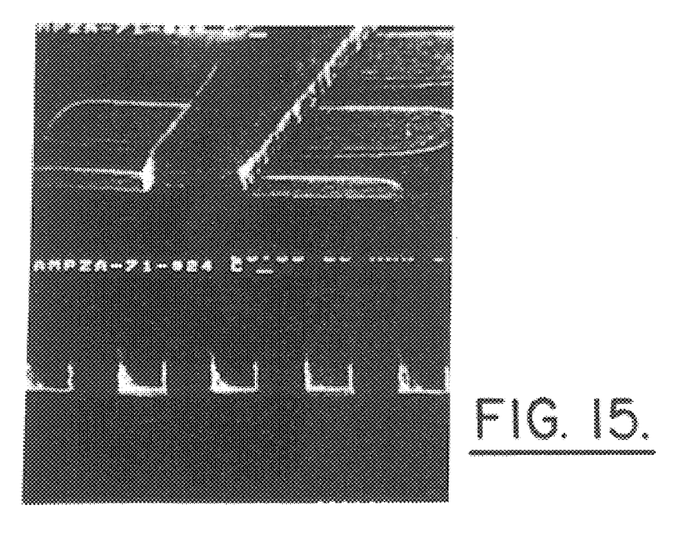

FIGS. 14 and 15 are SEM photographs illustrating profiles of the polycide gate structures formed using different substrate temperatures and bias powers during the dry etch. In FIG. 14, the temperature of the substrate was maintained at 50° C., and a bias power of 150 W was applied. In FIG. 15, the temperature of the substrate was maintained at −50° C., and a bias power of 200 W was applied. When the temperature of the substrate is maintained at 50° C., a good sidewall profile can be obtained and the residues can be removed if a bias power of 150 W is applied. When the temperature of the substrate is maintained at −50° C. during the dry etch, a good sidewall profile can be obtained if a bias power of 200 W is applied. A small amount of residue may, however, remain on the bottom surface of the polycide gate structure.

As described above, when $Cl_2$ and $O_2$ are mixed at an appropriate ratio and used as an etching gas, and when the temperature of the substrate is over 0° C. and the applied bias power is over 150 W, a good sidewall profile can be obtained and the generation of residues can be reduced. Even when the temperature of the substrate is below 0° C. during the dry etch, a good sidewall profile can be obtained and the residues can be reduced if the applied bias power is about 250 W.

If the polycide gate is applied to a highly-integrated memory device such as a 1 gigabit dynamic random access memory (DRAM), the polysilicon layer and gate oxide layer may be reduced in thickness to about 500 Å and tens of Å in thickness, respectively. If a higher bias power is applied when etching the $TiSi_x$ layer, pitting can thus be generated on the gate oxide layer. Because the gate oxide and polysilicon layers become thinner with an increase in the integration of a device and because pitting may occur on the gate oxide layer, it may be advantageous to etch the structure at a relatively high substrate temperature allowing a relatively wide margin for the bias power. A small amount of erosion occurring under the conditions discussed above can be remedied through the adjustment of other process conditions.

Etching conditions will now be discussed to reduce the generation of residues between gate structures when a LPCVD nitride layer is used as the etching mask. As discussed above, LPCVD and PECVD nitride layers are usually used to provide the mask when etching silicide layers. While the LPCVD nitride layer mask may provide improved sheet resistance (Rs), a LPCVD nitride layer mask may cause residues during the etch.

Figure 2:
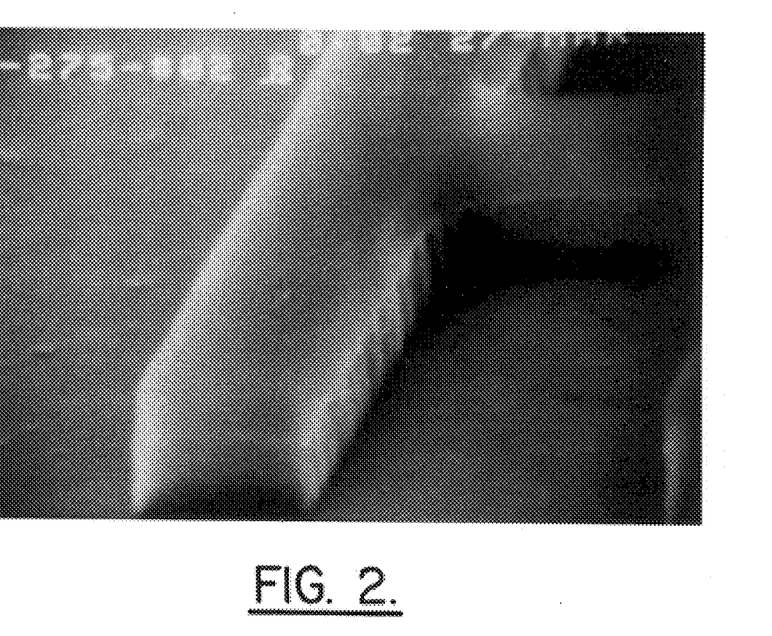
FIG. 2 is a scanning electron microscope (SEM) photograph of a polycide pattern etched using a low pressure chemical vapor deposition (LPCVD) nitride layer mask according to the prior art.

As previously discussed, a titanium polycide layer etched using a LPCVD nitride layer mask is shown in FIG. 2. The LPCVD nitride layer mask is deposited at a temperature of approximately 780° C., and the polycide layer is etched using a gas mixture including chlorine gas and oxygen gas. The titanium polycide layer can alternately be etched using a gas mixture including chlorine gas, oxygen gas, and nitrogen gas.

As shown in FIG. 2, the erosion of the sidewalls of the polycide pattern is reduced, but residues may attach to the sidewalls of the pattern. These residues, however, can be reduced when a PECVD nitride layer is used as the etching mask. Furthermore, the residues occur only when the LPCVD nitride layer mask is deposited at a temperature of 500° C. or more. The residues are generated as a result of a nonvolatile byproduct such as silicon-oxygen that is generated as a result of the reaction of extra silicon which is segregated when the silicide layer is heated with oxygen of the chlorine and oxygen gas mixture which is used as the etching gas.

The generation of residues when using a LPCVD nitride masking layer can be reduced by using an etching gas including a mixture of chlorine gas, oxygen gas, and a gas including fluorine such as carbon tetrafluoride ($CF_4$). Nitrogen ($N_2$) can also be included in the etching gas mixture. Alternately, the gas including fluorine can be a gas such as sulfur hexafluoride ($SF_6$). Preferably the volumetric ratio of chlorine gas to oxygen gas is approximately 4 to 1.

Because fluorine can etch silicon, the addition of fluorine to the etching gas mixture allows extra silicon existing on the titanium silicide layer to be effectively etched. A volatile byproduct having a composition of Si—F or C—O is thus generated so that residues are less likely to remain after the completion of the etching step.

Figure 16:
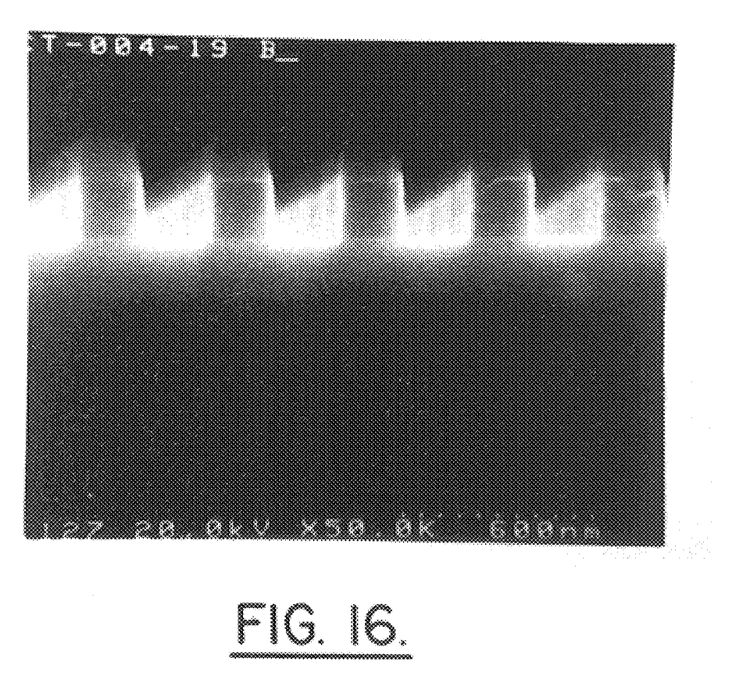
FIG. 16 is a scanning electron microscope (SEM) photograph of a titanium polycide pattern etched using a gas mixture including chlorine gas ($Cl_2$), oxygen gas ($O_2$), and carbon tetrafluoride ($CF_4$) according to the present invention.

FIG. 16 is a scanning electron microscope (SEM) photograph of a titanium polycide pattern etched using an etching gas mixture including chlorine gas ($Cl_2$), oxygen gas ($O_2$), and carbon tetrafluoride ($CF_4$). In particular, the carbon tetrafluoride is added as 20 percent of the volumetric gas flow rate. As shown, the erosion of the pattern sidewalls and the generation of residues is reduced, and an oxide layer having an initial thickness of 70 Angstroms is reduced to an average thickness of 66.7 Angstroms after the etching step is completed. The addition of fluorine to an etching gas mixture including chlorine gas and oxygen gas, or chlorine gas, oxygen gas, and nitrogen gas can reduce sidewall erosion of polycide patterns. The addition of fluorine can also reduce the generation of undesirable residues and the undesired loss of gate oxide thickness.

When sputtered titanium silicide is used in the formation of a gate electrode, a vertical pattern profile can be formed using an etching gas including chlorine gas and oxygen gas. This etching gas mixture, however, may result in undesired pitting and residues due to a reduced etching margin caused by residue removal. When fluorine is added to the etching gas mixture, the pitting and residue generation can be reduced simultaneously. In particular, residues can be reduced because silicon-oxygen byproducts can be effectively removed as volatile byproducts such as Si—F and C—O with the addition of the fluorine gas.

As the amount of fluorine in the etching gas mixture increases, the content of the chlorine gas which provides the primary etching source may decrease. The etching rate of the titanium silicide layer may thus be reduced with the addition of the gas including fluorine. The morphology of the polysilicon film after the etch using the mixture including chlorine, oxygen, and fluorine may be improved. The etching margin of the gate oxide layer may be increased thereby reducing undesired pitting.

Figure 17:
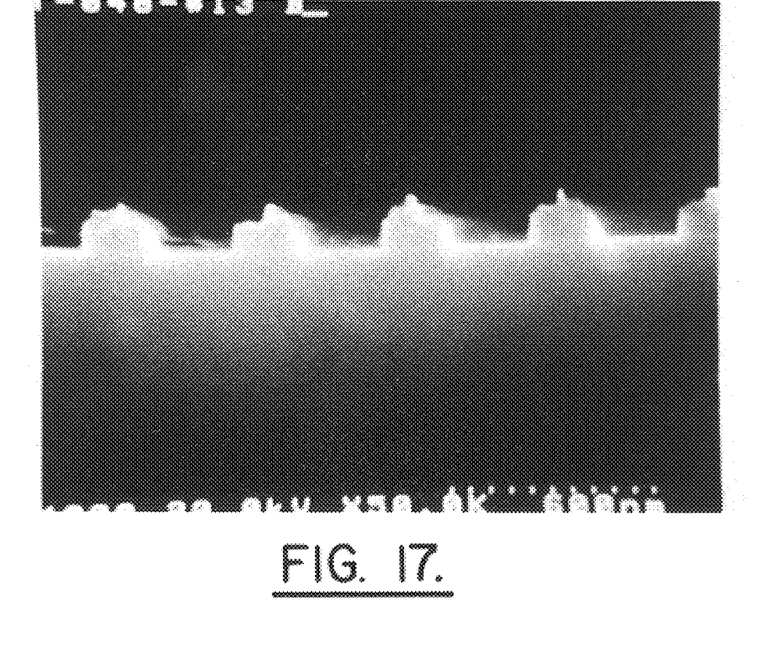
FIG. 17 is a scanning electron microscope (SEM) photograph of a titanium silicide layer formed using chemical vapor deposition and etched using chlorine gas ($Cl_2$) and oxygen gas ($O_2$).
Figure 18:
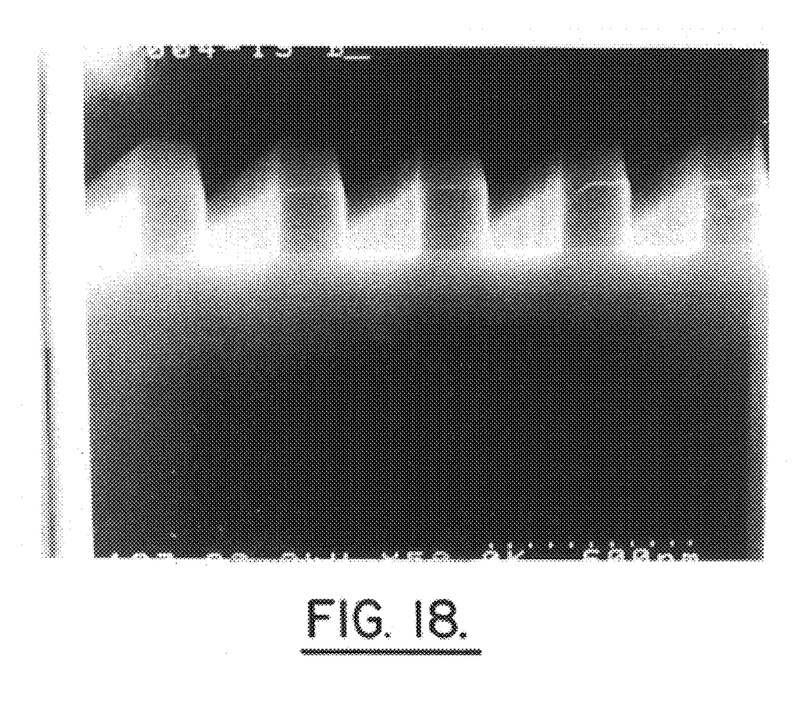
FIGS. 18–22 are scanning electron microscope (SEM) photographs of a titanium polycide layer etched using a gas mixture including chlorine gas ($Cl_2$), oxygen gas ($O_2$), and carbon tetrafluoride ($CF_4$).
Figure 19:
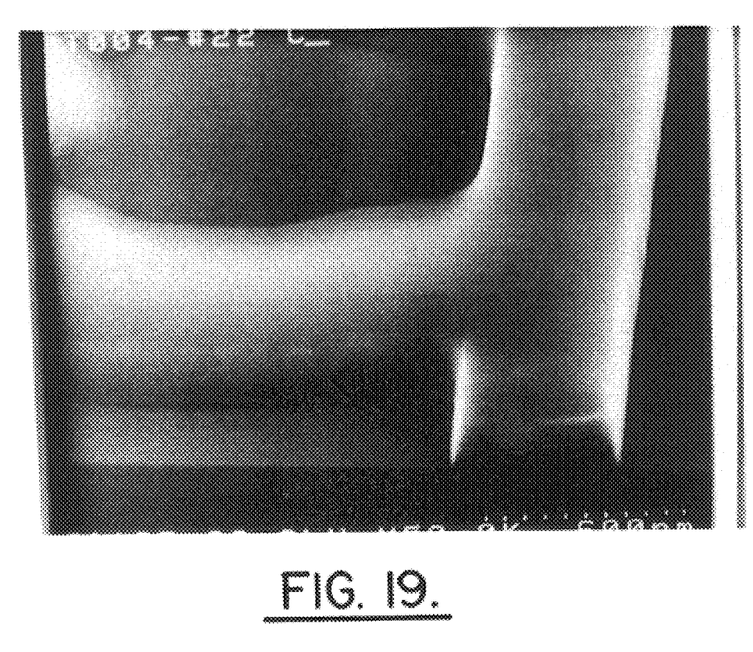
Figure 20:
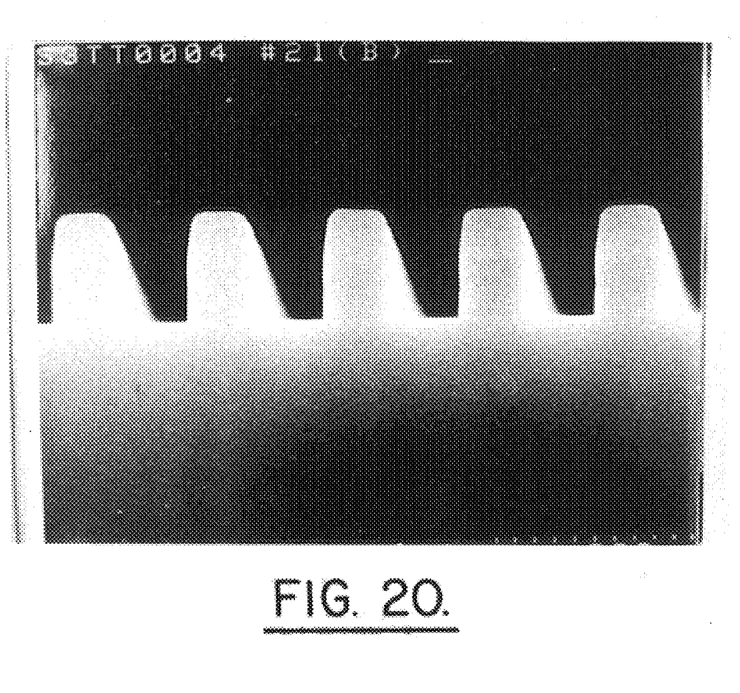
Figure 21:
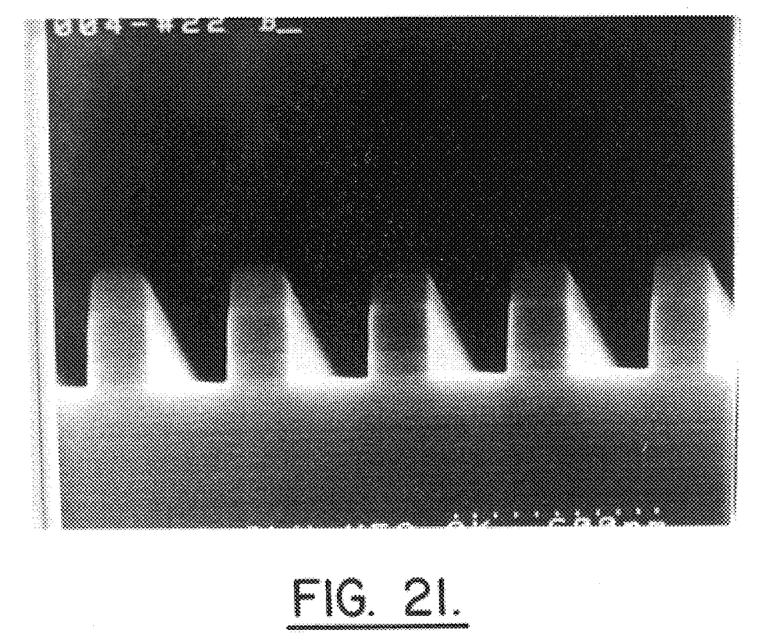
Figure 22:
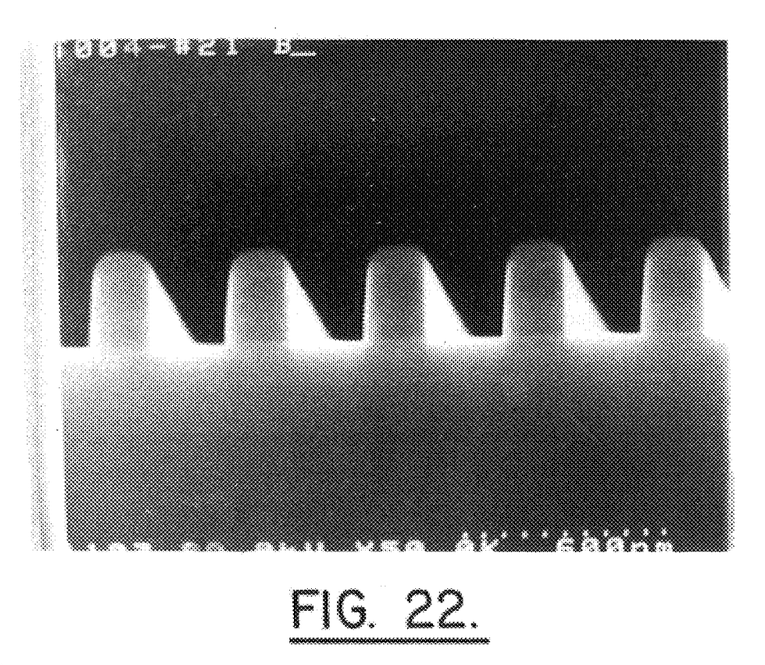

In contrast to when the sputtered titanium silicide is etched, when titanium silicide is deposited by a chemical vapor deposition technique and etched using an etching gas mixture including chlorine gas and oxygen gas, the erosion of the patterned sidewalls may be severe as shown in FIG. 17. As shown, the use of an etching gas mixture including only chlorine gas and oxygen gas may be insufficient to protect the sidewalls. When a titanium silicide layer formed by chemical vapor deposition is etched using an etching gas mixture including chlorine gas, oxygen gas, and a carbon-fluorine series gas, the erosion of sidewall patterns and the generation of residues are reduced. A vertical pattern profile with reduced residues in sidewall erosion can thus be obtained. By adding the carbon-fluorine series gas, a carbon compound such as Ti—C or Si—C or a compound such as TiF can be formed on the sidewalls of the pattern thereby providing a protective layer.

The effective sidewall protection by the addition of the carbon-fluorine series gas when etching a sputter titanium silicide layer can be checked by observing the degree of sidewall erosion while varying the flow rate of the carbon-fluorine series gas. In particular, the etching step is carried out as discussed below.

The main etching of the sputtered titanium silicide film is performed at a pressure of 2 mTorr and an electric power of 300–375 W using an etching gas including a mixture of carbon tetrafluoride, chlorine, and oxygen with an end point detection (EPD) technique. In particular, the volumetric ratio of the carbon tetrafluoride ($CF_4$) was provided at 20%, 30%, 40%, 50%, and 80% of the entire etching gas flow. The volumetric ratio of chlorine gas ($Cl_2$) to oxygen gas ($O_2$) is maintained at 4 to 1.

In addition, a 30% overetch is performed using the same etch conditions discussed above. The etching of the polysilicon layer is carried out at a pressure of 3.5 mTorr and an electric power of 90–300 W using an etching gas mixture including $21Cl_2/9O_2$ and using a timed etch technique.

FIGS. 18 to 22 are scanning electron microscope (SEM) photographs of a titanium polycide layer etched using the etching gas mixture including carbon tetrafluoride gas ($CF_4$), chlorine gas ($Cl_2$), and oxygen gas ($O_2$) with the volumetric content of the carbon tetrafluoride in the entire etching gas mixture being 20%, 30%, 40%, 50%, and 80%, respectively. As shown, when an etching gas mixture including $Cl_2/O_2$ is used, a vertical profile can be obtained but residues and pitting may occur. When the carbon-fluorine series gas is added to the etching gas mixture, however, a vertical profile can be maintained while reducing the generation of residues.

In addition to carbon tetrafluoride ($CF_4$), the carbon-fluorine series gas can be hexafluoroethane ($C_2F_6$), decafluorobutane ($C_4F_{10}$), or methane monofluoride ($CH_3F$). If the carbon-fluorine series gas makes up more than 80% of the total volumetric gas flow rate for the etching gas mixture, undesired mask loss may occur during the etching step. It is thus preferred that the carbon-fluorine series gas be less than 80% of the entire volumetric gas flow rate for the etching gas mixture.

Although titanium silicide ($TiSi_x$) has been discussed, other silicide gate structures can be used according to the present invention. It is thus apparent that various modifications may be affected by those skilled in the art within the technical spirit of the present invention.

According to the methods of the present invention, a gas mixture of chlorine and oxygen can be adjusted to an appropriate ratio when etching a polycide gate structure so that sidewall erosion of the polycide pattern can be reduced. Moreover, the temperature at which the etching step occurs can be set to an appropriate level to further reduce undesired sidewall erosion. Residues can be reduced by applying a predetermined bias power. In addition, a predetermined amount of a fluorine or carbon-fluorine series gas can be added to the etching gas mixture of chlorine and oxygen to further reduce sidewall erosion and residues. The use of the gas including fluorine can also reduce undesired reductions in the thickness of the gate oxide layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a gate structure on a semiconductor substrate, said method comprising the steps of:

forming a gate oxide layer on the semiconductor substrate;

forming a layer of a gate material on said gate oxide layer opposite the semiconductor substrate wherein said layer of said gate material comprises a polysilicon layer on said gate oxide layer opposite the substrate and a silicide layer on said polysilicon layer opposite the substrate;

forming a patterned mask layer on said layer of said gate material opposite said substrate; and etching said layer of said gate material including both said silicide layer and said polysilicon layer with an etching gas including a mixture of chlorine gas ($Cl_2$) and oxygen gas ($O_2$), and a gas including fluorine (F) to expose a portion of said gate oxide layer.

2. A method according to claim 1 wherein said gas including fluorine (F) comprises a gas chosen from the group consisting of sulfur hexafluoride ($SF_6$) and carbon tetrafluoride ($CF_4$).

3. A method according to claim 1 wherein said gas including fluorine comprises a carbon-fluorine (C-F) series gas.

4. A method according to claim 3 wherein said carbon-fluorine series gas is chosen from the group consisting of carbon tetrafluoride ($CF_4$), hexafluoroethane ($C_2F_6$), decafluorobutane ($C_4F_{10}$), and methane monofluoride ($CH_3F$).

5. A method according to claim 1 wherein said mask layer comprises a silicon nitride layer.

6. A method according to claim 5 wherein said patterned silicon nitride mask layer is formed by low pressure chemical vapor deposition (LPCVD) at a temperature of at least 500° C.

7. A method according to claim 1 wherein said gas including fluorine makes up no more that 80% of the etching gas by volume.

8. A method according to claim 1 wherein the etching gas including chlorine gas, oxygen gas, and a gas including fluorine is mixed with nitrogen.

9. A method according to claim 1 wherein a volumetric ratio of said chlorine gas to said oxygen gas is approximately 4 to 1.

10. A method of patterning a layer on a substrate, said method comprising the steps of:

forming a gate oxide layer on a surface of the substrate;

forming a layer of a material to be patterned on said oxide layer opposite the substrate wherein said layer of said material comprises a polysilicon layer on said oxide layer opposite the substrate and a silicide layer on said polysilicon layer opposite the substrate;

forming a patterned mask layer on said layer of said material opposite said substrate; and etching said layer of said material including etching both said suicide layer and said polysilicon layer with an etching gas including a mixture of chlorine gas ($Cl_2$), oxygen gas ($O_2$), and a gas including fluorine (F) to expose a portion of said oxide layer.

11. A method according to claim 10 wherein said gas including fluorine (F) comprises a gas chosen from the group consisting of sulfur hexafluoride ($SF_6$) and carbon tetrafluoride ($CF_4$).

12. A method according to claim 10 wherein said gas including fluorine comprises a carbon-fluorine (C-F) series gas.

13. A method according to claim 12 wherein said carbon-fluorine series gas is chosen from the group consisting of carbon tetrafluoride ($CF_4$), hexafluoroethane ($C_2F_6$), decafluorobutane ($C_4F_{10}$), and methane monofluoride ($CH_3F$).

14. Method according to claim 10 wherein said mask layer comprises a silicon nitrade layer.

15. A method according to claim 14 wherein said patterned silicon nitride mask layer is formed by low pressure chemical vapor deposition (LPCVD) at a temperature of at least 500° C.

16. A method according to claim 10 wherein said gas including fluorine makes up no more that 80% of the etching gas by volume.

17. A method according to claim 10 wherein the etching gas including chlorine gas, oxygen gas, and a gas including fluorine is mixed with nitrogen.

18. A method according to claim 10 wherein a volumetric ratio of said chlorine gas to said oxygen gas is approximately 4 to 1.

19. A method of forming a gate having a polycide structure on an integrated circuit substrate, said method comprising the steps of:

forming a gate oxide layer on a surface of the substrate;

forming a polysilicon layer on said gate oxide layer opposite the surface of the substrate;

forming a silicide layer on said polysilicon layer opposite the substrate;

forming a patterned mask layer on said silicide layer opposite said substrate; and etching said silicide layer and said polysilicon layer with an etching gas including a mixture of chlorine gas ($Cl_2$), oxygen gas ($O_2$), and a gas including fluorine (F) to expose a portion of said gate oxide layer.

20. A method according to claim 19 wherein said gas including fluorine (F) comprises a gas chosen from the group consisting of sulfur hexafluoride ($SF_6$) and carbon tetrafluoride ($CF_4$).

21. A method according to claim 19 wherein said gas including fluorine comprises a carbon-fluorine (C-F) series gas.

22. A method according to claim 21 wherein said carbon-fluorine series gas is chosen from the group consisting of carbon tetrafluoride ($CF_4$), hexafluoroethane ($C_2F_6$), decafluorobutane ($C_4F_{10}$), and methane monofluoride ($CH_3F$).

23. A method according to claim 19 wherein said mask layer comprises a silicon nitride layer.

24. A method according to claim 23 wherein said patterned silicon nitride mask layer is formed by low pressure chemical vapor deposition (LPCVD) at a temperature of at least 500° C.

25. A method according to claim 19 wherein said gas including fluorine makes up no more that 80% of the etching gas by volume.

26. A method according to claim 19 wherein the etching gas including chlorine gas, oxygen gas, and a gas including fluorine is mixed with nitrogen.

27. A method according to claim 19 wherein a volumetric ratio of said chlorine gas to said oxygen gas is approximately 4 to 1.

* * * * *